United States Patent
Chung et al.

(10) Patent No.: US 7,982,818 B2
(45) Date of Patent: Jul. 19, 2011

(54) FLEXIBLE CIRCUIT BOARD OF LIQUID CRYSTAL DISPLAY COMPRISING A TRIANGULAR LIGHT ABSORBING LAYER

(75) Inventors: Jaemo Chung, Yongin-si (KR); Jinhee Sung, Yongin-si (KR); Sunghwan Kim, Yongin-si (KR)

(73) Assignee: Samsung Mobile Display Co., Ltd., Geyonggi-do (KR)

( * ) Notice: Subject to any disclaimer, the term of this patent is extended or adjusted under 35 U.S.C. 154(b) by 1065 days.

(21) Appl. No.: 11/743,310

(22) Filed: May 2, 2007

(65) Prior Publication Data
US 2008/0158474 A1 Jul. 3, 2008

(30) Foreign Application Priority Data
Jan. 3, 2007 (KR) .................. 10-2007-0000787

(51) Int. Cl.
G02F 1/1335 (2006.01)
G02F 1/1345 (2006.01)
F21V 7/04 (2006.01)

(52) U.S. Cl. ............ 349/61; 349/69; 349/149; 362/608; 362/611

(58) Field of Classification Search .................. 349/152, 349/61
See application file for complete search history.

(56) References Cited

U.S. PATENT DOCUMENTS

| 4,439,818 A | 3/1984 | Scheib |
| 6,614,179 B1 | 9/2003 | Shimizu et al. |
| 7,576,805 B2 * | 8/2009 | Ito et al. ............ 349/15 |
| 2001/0005315 A1 | 6/2001 | Suzuki et al. |
| 2003/0051807 A1 | 3/2003 | Yamaguchi et al. |
| 2003/0194507 A1 | 10/2003 | Secord et al. |
| 2004/0006161 A1 | 1/2004 | Daido et al. |
| 2005/0068472 A1 * | 3/2005 | Sung et al. ............ 349/64 |
| 2005/0088830 A1 * | 4/2005 | Yumoto et al. ............ 361/749 |
| 2005/0190333 A1 | 9/2005 | Wu et al. |
| 2006/0006777 A1 | 1/2006 | Lo et al. |
| 2006/0082297 A1 | 4/2006 | Camp |
| 2006/0109394 A1 | 5/2006 | Miyagawa et al. |
| 2006/0152664 A1 | 7/2006 | Nishio et al. |

(Continued)

FOREIGN PATENT DOCUMENTS
DE 103 50 099 6/2005

(Continued)

OTHER PUBLICATIONS

U.S. Office Action dated Dec. 14, 2009, issued in corresponding U.S. Appl. No. 11/949,201.

(Continued)

Primary Examiner — Mark A Robinson
Assistant Examiner — Charles Chang
(74) Attorney, Agent, or Firm — Knobbe Martens Olson & Bear LLP (57) ABSTRACT

A flexible circuit board of a liquid crystal display device includes a first insulating film, a plurality of conductive patterns formed on the first insulating film, a second insulating film formed on the first insulating film to cover the conductive pattern, a plurality of light sources coupled to the conductive pattern, and an upper light absorbing layer formed on an outer circumference of the light source to absorb light emitted from the light source, wherein the upper light absorbing layer is formed in a triangle shape on one side of the light source.

18 Claims, 4 Drawing Sheets

U.S. PATENT DOCUMENTS

| | | | |
|---|---|---|---|
| 2006/0234047 A1* | 10/2006 | Wenninger et al. | 428/355 R |
| 2006/0268551 A1 | 11/2006 | Mok et al. | |
| 2007/0096272 A1* | 5/2007 | Wang | 257/675 |

FOREIGN PATENT DOCUMENTS

| | | |
|---|---|---|
| JP | 7-92480 | 4/1995 |
| JP | 9-274446 | 10/1997 |
| JP | 10-168411 | 6/1998 |
| JP | 2000-231096 | 8/2000 |
| JP | 2003-242817 | 8/2003 |
| JP | 2003-330377 | 11/2003 |
| JP | 2003-344851 | 12/2003 |
| JP | 2006-30726 | 2/2006 |
| JP | 2006-154008 | 6/2006 |
| JP | 2006-349789 | 12/2006 |
| KR | 2005-118530 | 12/2005 |
| KR | 2006-236 | 1/2006 |
| KR | 10-2006-0036298 | 4/2006 |
| KR | 10-2006-0058596 | 5/2006 |
| KR | 10-2006-0071553 | 6/2006 |
| KR | 10-2006-0082471 | 7/2006 |
| KR | 2006-88940 | 8/2006 |
| KR | 2006-90392 | 8/2006 |
| KR | 10-2006-0123912 | 12/2006 |
| KR | 2006-126074 | 12/2006 |
| KR | 10-2007-0000073 | 1/2007 |

OTHER PUBLICATIONS

U.S. Office Action dated Jun. 8, 2009, issued in corresponding U.S. Appl. No. 11/949,201.

U.S. Appl. No. 11/949,138, filed Dec. 3, 2007, Jaemo Chung et al., Samsung SDI Co., Ltd.

U.S. Appl. No. 11/949,201, filed Dec. 3, 2007, Jaemo Chung et al., Samsung SDI Co., Ltd.

Japanese Office Action dated Aug. 3, 2010, issued in corresponding Japanese Patent Application No. 2007-046045.

Translation of JP 2003-330377.

* cited by examiner

FLEXIBLE CIRCUIT BOARD OF LIQUID CRYSTAL DISPLAY COMPRISING A TRIANGULAR LIGHT ABSORBING LAYER

CROSS-REFERENCE TO RELATED APPLICATION

This application claims the benefit of Korean Application No. 2007-787, filed Jan. 3, 2007 in the Korean Intellectual Property Office, the disclosure of which is incorporated herein by reference.

BACKGROUND OF THE INVENTION

1. Field of the Invention

Aspects of the present invention relate to a flexible circuit board of a liquid crystal display device, and in particular, to a flexible circuit board of a liquid crystal display device having a light absorbing layer.

2. Description of the Related Art

Generally, a liquid crystal display device is one of several flat display devices to display images. The liquid crystal display device displays the images by using a liquid crystal. The liquid crystal display device is advantageous in that it is thin and light compared with other display devices, requires a low driving voltage, and consumes little power. Accordingly, the liquid crystal display device has been widely used in all fields of industry.

Such a liquid crystal display device includes a thin film transistor (hereinafter, referred to as TFT) substrate, a color filter substrate opposing the TFT substrate, and a liquid crystal display panel that includes a liquid crystal which changes the transmission amount of light according to an electrical signal applied thereto.

Further, a driving module is coupled to the liquid crystal display device to apply an electrical signal to drive the liquid crystal display panel coupled to the liquid crystal display device. For this purpose, a flexible circuit substrate is disposed between the liquid crystal display panel and the driving module.

Since the liquid crystal that is included in the liquid crystal display panel can not emit light by itself, the liquid crystal display panel needs a light source to supply light having a brightness exceeding a predetermined level in order to display an image.

A high brightness light emitting diode has recently come into use as a light source for medium and/or small sized devices such as a mobile phone, a PMP (portable multimedia player) and a digital camera to enable the thickness and the weight of the noted devices to be thinner and lighter. As an example, such a light source is coupled to the flexible circuit substrate, and the light emitted from the light source is transmitted to a light guide plate arranged on the back side of the liquid crystal display panel.

In the above devices, light emitted from the light source that is mounted on the flexible circuit substrate should be transmitted to the light guide plate. However, some of the light is not transmitted to the light guide plate, but is transmitted to unwanted regions of the flexible circuit substrate. That is, since a conductive pattern is formed on the flexible circuit substrate, and passive elements such as a resistor and a capacitor are mounted, light emitted from the light source is transmitted to the conductive pattern or the passive elements. Because light emitted from the light source includes the energy of a regular or certain intensity, and the energy thereof affects the conductive pattern and the passive elements, the passive elements and the liquid crystal display panel malfunction. Therefore, though the structure in which the light source is mounted on the flexible circuit substrate is a technology that should be employed to address the recent trend towards use of slim and light-weight devices, since light emitted from the light source causes various passive elements to malfunction, the technology employing the above has a problem in that reliability thereof deteriorates.

SUMMARY OF THE INVENTION

Aspects of the present invention is devised to solve the above-mentioned problems and other problems, and an aspect of the present invention is to provide a flexible circuit board of a liquid crystal display device to prevent the light emitted from a light source from being introduced to the conductive pattern and the passive elements, and other benefits.

In order to accomplish the above and/or other aspects, a flexible circuit board including a light absorbing layer of a liquid crystal display device according to an aspect of the present invention includes a first insulating film, a plurality of conductive patterns formed on the first insulating film, a second insulating film formed on the first insulating film to cover the plurality of conductive patterns, at least one light source coupled to the conductive pattern, and a light absorbing layer formed on an outer circumference of the light source to absorb light emitted from the light source, wherein the light absorbing layer is formed as a triangle shape on one side of the light source.

According to an aspect of the present invention, the light absorbing layer can be disposed between the light source and a light guide plate.

According to an aspect of the present invention, the light absorbing layer can be formed as an inverted triangle shape on the upper side of the at least one light source in a direction from the light source to the light guide plate.

According to an aspect of the present invention, a vertex of one side of the light absorbing layer in the inverted triangle shape can be formed toward the light source, and an angle of the vertex ranges from about 90 degrees to about 160 degrees.

According to an aspect of the present invention, a vertex of one side of the light absorbing layer in the inverted triangle shape can be formed toward the light source, and an angle of the vertex is about 120 degrees.

According to an aspect of the present invention, the light absorbing layer can be formed on a side of the second insulating film as an outer circumference of the light source, and a another light absorbing layer can be formed on a side of the first insulating film.

According to an aspect of the present invention, a size of the another light absorbing layer can be larger than a size of the upper light absorbing layer.

According to an aspect of the present invention, at least one passive element coupled to the conductive pattern can be further formed on an outer circumference of the upper light absorbing layer.

According to an aspect of the present invention, the another light absorbing layer can also be formed on a surface of the first insulating film corresponding to the passive element.

According to an aspect of the present invention, the light absorbing layer and the another light absorbing layer includes diethylene glycol monoethyl ether acetate, titanium dioxide, and/or epoxy resin.

According to an aspect of the present invention, the light source can be a light emitting diode.

According to an aspect of the present invention, the first insulating film includes a first region on which the light source and the light absorbing layers are formed, a second region which is formed on one side of the first region and to which a liquid crystal display panel is coupled, and a third region which is formed on one side of the second region and to which an external controller is coupled.

According to an aspect of the present invention, first cutout portions are spaced apart from each other and are symmetrically formed in the second region, second cutout portion is formed between the first cutout portions, and a panel connector coupled to a liquid crystal display panel can be further formed in a cutout region formed by the first cutout portions and the second cutout portion.

According to an aspect of the present invention, the panel connector can be formed by allowing the conductive patterns to be exposed to the outside of a first insulating film.

According to an aspect of the present invention, a controller connector coupled to an external controller can be formed in the third region.

According to an aspect of the present invention, the controller connector can be formed by allowing the conductive pattern to be exposed to the outside of the first insulating film.

According to an aspect of the present invention, a fixing hole can be further formed at the respective corresponding positions of the first and third region.

According to an aspect of the present invention, as described above, a flexible circuit board of a liquid crystal display device further includes the another light absorbing layer and the light absorbing layer on the outer circumference of a light source to minimize the light emitted from the light source from being introduced to the conductive pattern and the passive elements. Accordingly, aspects of the present invention can prevent or reduce malfunction of the passive elements and the liquid crystal display panel effectively.

According to an aspect of the present invention, in a flexible circuit board of a liquid crystal display device, the light source and the passive elements are formed in the first region, the panel connector coupled to the liquid crystal display panel is formed in the second region, and the controller connector coupled to an external controller is formed in the third region. Therefore, it is possible to establish an electrical connection of many parts on a minimum amount of space effectively. Accordingly, it becomes easy to apply aspects of the present invention to the portable display devices which are getting slimmer and lighter.

According to an aspect of the present invention, a flexible circuit board of a liquid crystal display device includes the first region, the second region, and the third region, all of which are formed by a flexible first insulating film and a flexible second insulating film. Therefore, it is possible to fold a desired area easily and the flexible circuit board can be easily applied to various kinds of portable display devices having many curved sections.

According to another aspect of the present invention, a flexible circuit board includes: a first insulating film; a plurality of conductive patterns formed on the first insulating film; a second insulating film formed on the first insulating film and/or the plurality of the conductive patterns; a light source coupled to the plurality of the conductive patterns; and a light absorbing layer formed over a portion of the second insulating film, the light absorbing layer comprising a straight base and an opposite vertex, wherein the base is disposed along a light emitting side of the light source.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the aspects, taken in conjunction with the accompanying drawings of which.

DETAILED DESCRIPTION OF THE EMBODIMENTS

Reference will now be made in detail to the aspects of the present invention, examples of which are illustrated in the accompanying drawings, wherein like reference numerals refer to the like elements throughout. The aspects are described below in order to explain the present invention by referring to the figures.

Figure 1A:
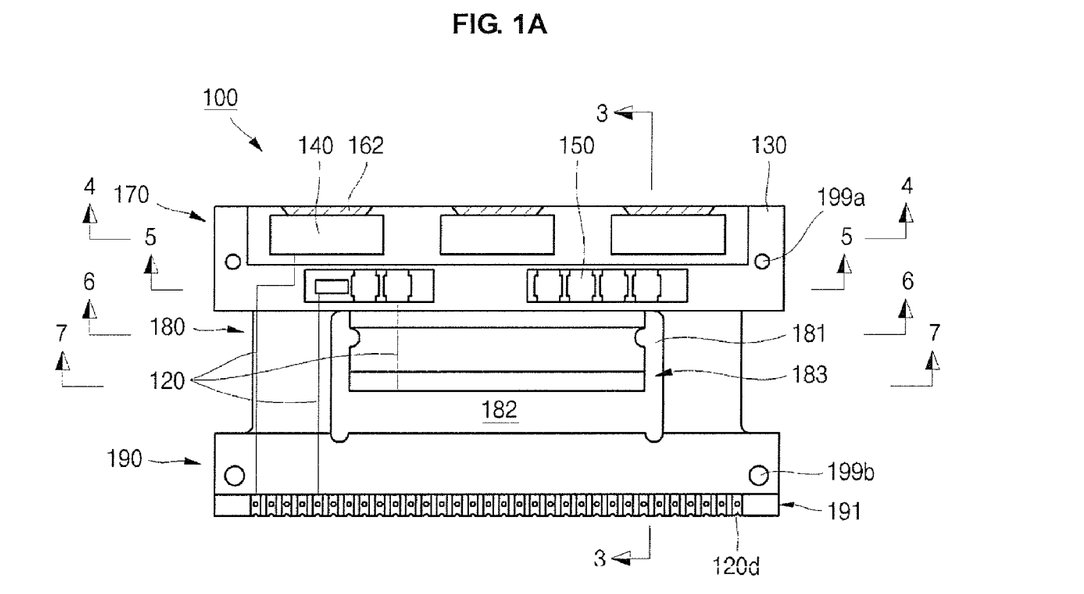
FIGS. 1A, 1B, and 1C are a top plan view, a side elevational view, and a bottom plan view of a flexible circuit board having a light absorbing layer of a liquid crystal display device according to an aspect of the present invention.
Figure 1B:
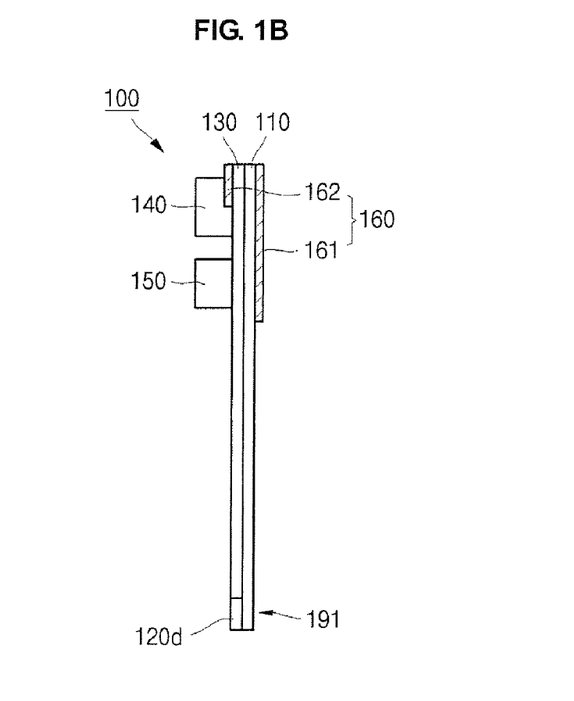
Figure 1C:
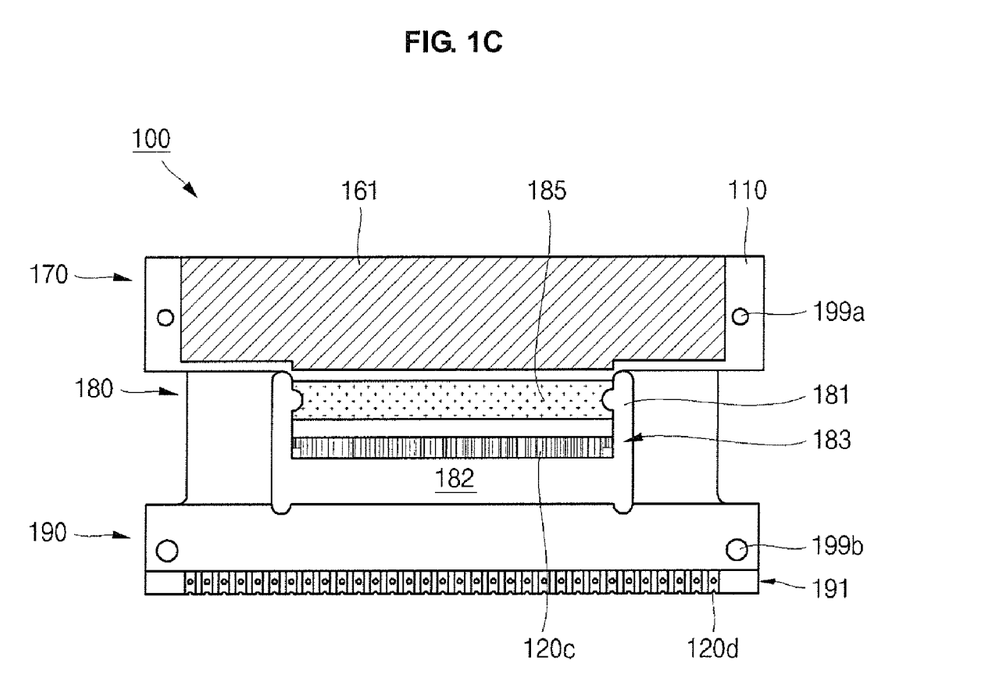
Figure 2:
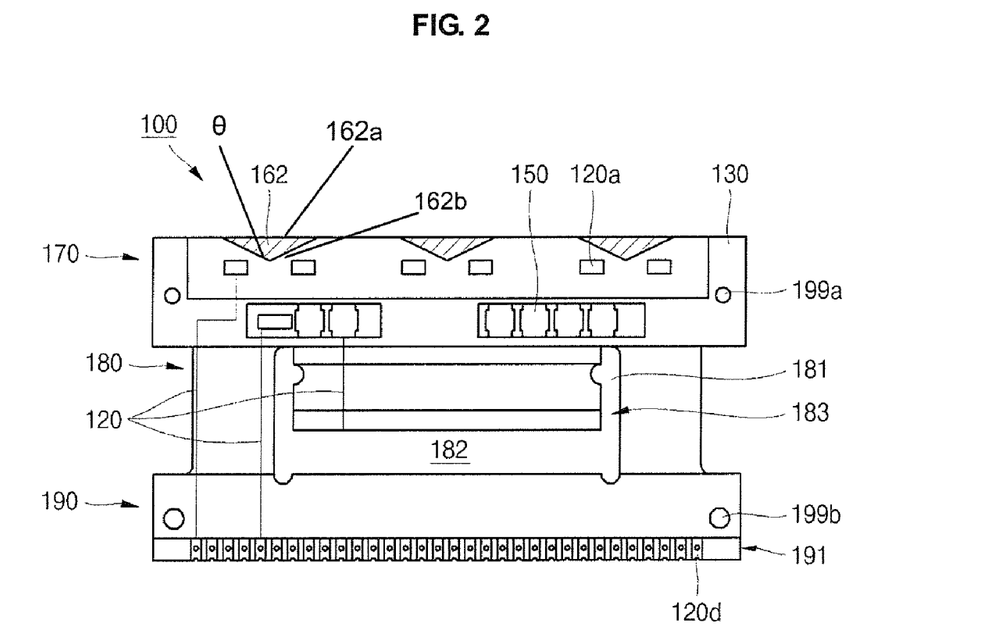
FIG. 2 is a top plan view of the state before a light source is mounted on a flexible circuit board having a light absorbing layer of a liquid crystal display device according to an aspect the present invention.

Referring to FIGS. 1A, 1B, and 1C, a top plan view, a side elevational view, and a bottom plan view of a flexible circuit board having a light absorbing layer of a liquid crystal display device according to an aspect of the present invention are illustrated. Referring to FIG. 2, a top plan view of the state before a light source is mounted on a flexible circuit board having a light absorbing layer of a liquid crystal display device according to an aspect of the present invention is illustrated.

As illustrated in FIGS. 1A, 1B, 1C, and FIG. 2, the flexible circuit board (or a flexible circuit substrate) 100 includes a first insulating film 110, a conductive pattern or patterns 120, a second insulating film 130, a light source or sources 140, a passive element or elements 150 and a light absorbing layer or layers 160.

In the non-limiting aspect shown, the first insulating film 110 is a base layer of the flexible circuit board 100, and can be formed by any one selected from a flexible polyimide and the equivalents thereof, but the materials are not limited thereto.

In the non-limiting aspect shown, the conductive pattern 120 is formed on the first insulating film 110. Such a conductive pattern 120 can be formed by any one selected from a copper thin film having a very high conductivity and the equivalents thereof, but the materials are not limited thereto. Such a conductive pattern 120 supplies power to various electronic parts which are coupled to the flexible circuit substrate 100 and the light source 140, for example, and/or supplies an electrical signal to the passive element 150. In FIG. 1A and FIG. 2, some of the conductive patterns 120 are illustrated, but the conductive pattern 120 can be formed with tens and/or thousands of patterns, in various aspects. In addition, since the second insulating film 130 is almost opaque, the conductive pattern 120 can be hardly (or not readily) seen.

In the non-limiting aspect shown, the second insulating film 130 is formed on the first insulating film 110 and is formed to cover the conductive pattern 120. Therefore, the second insulating film 130 is exposed to the outside of (or through) the conductive pattern 120 and damages thereto can be prevented or reduced. The second insulating film 130, for example, is not formed on the conductive pattern 120 of the parts (a conducting pad or pads 120a) to which the light source 140 and the passive element 150 are coupled. The second insulating film 130 can be formed by any one selected from a cover film and the equivalents thereof, but the materials are not limited thereto. In various aspects, the various films 110 and/or 130 are flexible.

In the non-limiting aspect shown, the light source 140 can be coupled to the conductive pattern 120. Substantially, the conducting pad 120a is formed on the conductive pattern 120, and the conducting pad 120a is exposed to the outside of (or through) the second insulating film 130. Therefore, the light source 140 can be coupled to the conducting pad 120a by soldering and/or other joining or attaching technique. In various aspects, the light source 140 can be formed by any one selected from a high brightness light emitting diode and the equivalents thereof, but the types of devices are not limited thereto. Further, in the drawings, illustrated therein are three light sources 140 arranged in a row. However, the number of the light source 140 is not limited in the various aspects of the present invention.

In the non-limiting aspect shown, the passive element 150 can also be coupled to the conductive pattern 120. A conducting pad 120*b* (depicted in FIG. 5) is formed on the conductive pattern 120, and the conducting pad 120*b* is exposed to the outside of (or through) the second insulating film 130. Therefore, the passive element 150 can be coupled to the conductive pattern 120*b* by soldering and/or other joining or attaching technique. In various aspects, the passive element 150 can be a resistor, a capacitor, an inductor, or any combinations thereof, but the kind of the passive element 150 is not limited thereto. In the drawings, illustrated are seven passive elements 150 are arranged in a row. However, the number of the passive elements 150 is not limited in the aspects of the present invention.

In the non-limiting aspect shown, the light absorbing layer 160 includes a lower (or a first) light absorbing layer 161 formed on the first insulating film 110 and an upper (or a second) light absorbing layer 162 formed on the second insulating film 130. The lower light absorbing layer 161 is formed on the first insulating film 110 which is on a side opposite to which the light source 140 and the passive element 150 are coupled. Further, the upper light absorbing layer 162 is formed on the second insulating film 130 that corresponds to the outer circumference of the light source 140. The upper light absorbing layer 162 is spaced apart from the conducting pad 120*a* by a predetermined distance so that the light source 140 can be easily connected to the conducting pad 120*a* that is exposed through the second insulating film 130. Accordingly, light emitted from the light source 140 is not and/or not readily introduced to the conductive pattern 120 and the passive elements 150 due to the structure of the lower light absorbing layer 161 and the upper light absorbing layer 162. That is, light emitted from the light source 140 are transmitted only or mostly to the light guide plate (shown in FIG. 8), and are not transmitted to the conductive pattern 120 or the passive element 150. In various aspects, the light absorbing layer 160 can be a compound formed by diethylene glycol monoethyl ether acetate (DCAC) ($C_8H_{16}O_4$), titanium dioxide ($TiO_2$) and/or epoxy resin, but the materials of the light absorbing layer 160 are not limited thereto. In various aspects, although discussed in terms of a particular orientation such as upper and lower for ease of description, various elements need not be so oriented. In various aspects, the elements are independent of the specific orientation, and should be viewed in their relative locations compared to other elements.

The light absorbing layer 160 having the structure as described above has a black color, and is referred commonly as a black silk. Further, since the light absorbing layer 160 is black, the light absorbing layer 160 can absorb light emitted from the light source 140 more effectively. The light absorbing layer 160 can be formed by any method selected from a screen printing, a photo-lithography, and/or the equivalents thereof, but the formation methods are not limited thereto. In addition, the light absorbing layer 160 can be formed by electroless plating and/or electrolytic plating, and/or can also be formed by coating a high polymer resin of a black color.

In the non-limiting aspect shown, the flexible circuit board 100 of a liquid crystal display device includes a first region 170, a second region 180, and a third region 190 in the top plan view of FIG. 1A, for example. For sake of convenience, explanation of the first insulating film 110 will be given in terms of the first region 170, the second region 180, and the third region 190.

In the non-limiting aspect shown, the first region 170 is an area in which the light source 140, the passive element 150, and the light absorbing layer 160, as described above, are formed. In this aspect, the lower light absorbing layer 161 of the light absorbing layer 160 can be formed on the entire surface of the first insulating film 110 corresponding to the first region 170. Further, the upper light absorbing layer 162 of the light absorbing layer 160 can be formed on a partial surface of the second insulating film 130. That is, the upper light absorbing layer 162 is formed only on or over the light source 140, and is not formed on or over the passive element 150. Therefore, the area (or a coverage area) of the lower light absorbing layer 161 becomes relatively larger than that of the upper light absorbing layer 162.

The second region 180 is formed on (or to) one side of the first region 170, and a panel connector 183 to enable a liquid crystal display panel to be coupled is formed thereon. For this purpose, first cutout portions 181, which are spaced apart from each other by a predetermined distance, are formed in the second region 180, and the second cuttings section (or second cutout portion) 182 is formed between the first cutout portions 181. Therefore, the first cutout portions 181 and the second cutout portion 182 are formed in an approximately "H" shape (or a block U shape). The panel connector 183 to be coupled to the liquid crystal display panel can be formed along a cutout area formed by the first cutout portions 181 and the second cutout portion 182. The conductive pattern 120*c* (depicted in FIG. 1C) is exposed to the outside through the first insulating film 110 in the panel connector 183. The reference number 185 in FIG. 1C is an ink layer having superior flexibility to enable the second region 180 to be bent or folded more easily than as compared to the first insulating film 110.

In the non-limiting aspect shown, the third region 190 is formed on (or to) one side of the second region 180, and a controller connector 191 to enable an external controller (not shown) to be coupled thereto is connected. A plurality of conductive patterns 120*d* are formed in the third region 190, along an edge thereof. The plurality of conductive patterns 120*d* are exposed to the outside through the first insulating film 110 and the second insulating film 130.

In the non-limiting aspect shown, fixing holes 199*a*, 199*b* can be formed at each of the corresponding positions of the first region 170 and the third region 190. In various aspects, the fixing holes 199*a*, 199*b* tightly fix the flexible circuit substrate 100 to a molding frame (not shown) when the flexible circuit substrate 100 is connected to a fixing protrusion (not shown) of the molding frame.

Figure 3:
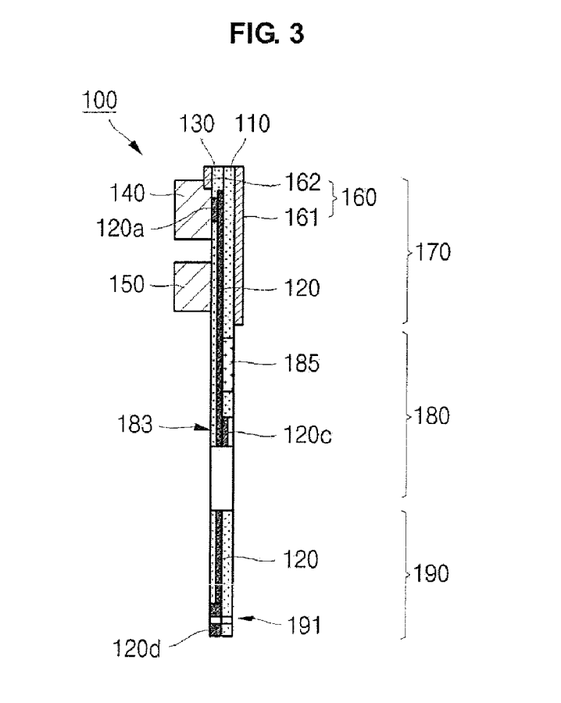
FIG. 3 is a cross-sectional view along line 3-3 of FIG. 1.

Referring to FIG. 3, a cross-sectional view along line 3-3 of FIG. 1 is illustrated. As illustrated, the flexible circuit substrate 100 includes the first region 170, the second region 180, and the third region 190. In the first region 170, the light source 140 is coupled to the conducting pad 120*a* formed on the conductive pattern 120. The passive element 150 is coupled to the conducting pad 120*b* (depicted in FIG. 5) formed on the conductive pattern 120. The lower light absorbing layer 161 is formed on the surface of the first insulating film 110 of the first region 170. Further, the upper light absorbing layer 162 is formed on the surface of the second insulating film 130 of the first region 170. Here, since the upper light absorbing layer 162 is formed such that a window (not shown) can be arranged on the outer circumference of the conducting pad 120*a*, the light source 140 can be coupled to the conducting pad 120*a* without any hindrances. Because of such a structure, light emitted from the light source 140 is not transmitted to the conductive pattern 120, and/or to the passive element 150 via the conductive pattern 120. Further, the upper light absorbing layer 162 is not formed on the region corresponding to the passive element 150.

In the non-limiting aspect shown, the panel connector 183 is formed in the second region 180, and the conducting pad 120*c* formed on the conductive pattern 120 is exposed to the outside of (or through) the panel connector 183. Further, the ink layer 185 having superior flexibility compared to the first insulating film 110 is formed in some portions of the second region 180 to enable greater flexibility to bend or fold the second region 180 easily. In various aspects, the ink layer 185 can be any one selected from a common ultra violet ray curing ink, an infrared ray curing ink, and/or the equivalents thereof, but the materials are not limited thereto.

In the non-limiting aspect shown, the controller connector 191 is formed in the third region 190, and the conducting pad 120d formed on the conductive pattern 120 is exposed to the outside of (or through) the controller connector 191.

Figure 4:
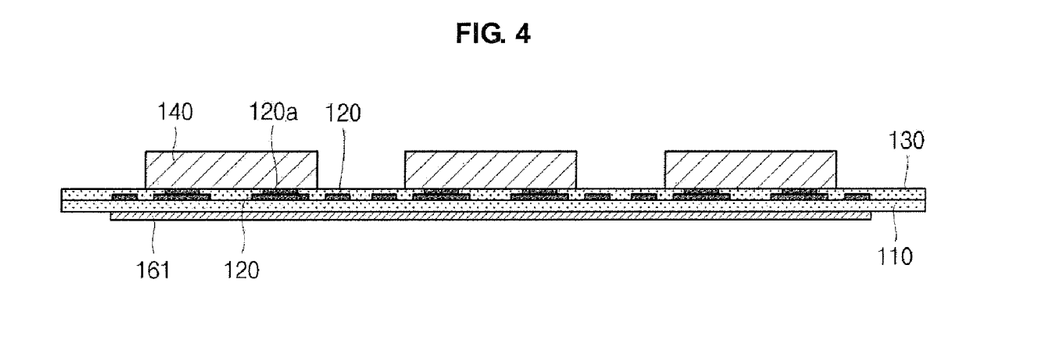
FIG. 4 is a cross-sectional view along line 4-4 of FIG. 1.

Referring to FIG. 4, a cross-sectional view along line 4-4 of FIG. 1 is illustrated. As illustrated, in the flexible circuit substrate 100, the light source 140, such as the high brightness light emitting diode, is mounted at a predetermined interval. Since the respective light source 140 is coupled to the conducting pad 120a formed on the conductive pattern 120 by soldering or other techniques, power is supplied via the conducting pad 120a and/or the conductive pattern 120. The lower light absorbing layer 161 is formed on the surface of the first insulating film 110, the upper light absorbing layer 162 is formed on the surface of the second insulating film 130. Accordingly, it is difficult for light emitted from the light source 140 to reach the conductive pattern 120.

Figure 5:
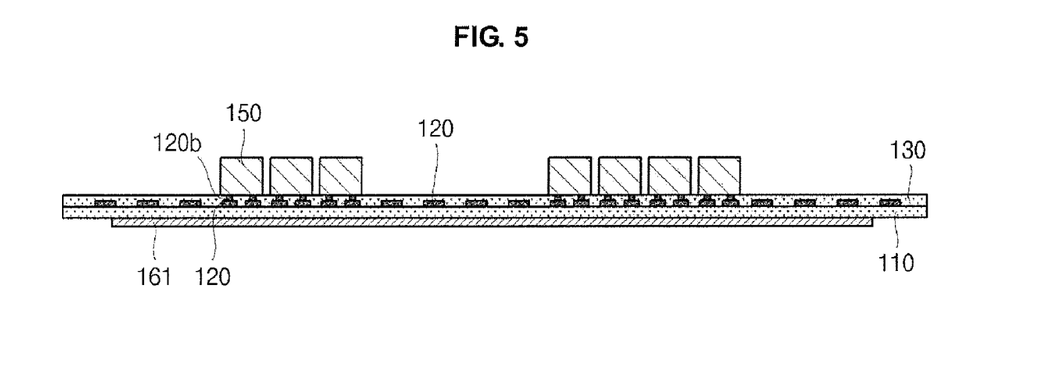
FIG. 5 is a cross-sectional view along line 5-5 of FIG. 1.

Referring to FIG. 5, a cross-sectional view along line 5-5 of FIG. 1 is illustrated. As illustrated, in the flexible circuit substrate 100, the passive element 150, such as a resistor, a capacitor and/or an inductor, is mounted at a predetermined interval. Since the respective passive element 150 is coupled to the conducting pad 120b formed on the conductive pattern 120 by soldering or other techniques, an electric signal is supplied thereto via the conducting pad 120b and/or the conductive pattern 120.

Figure 6:
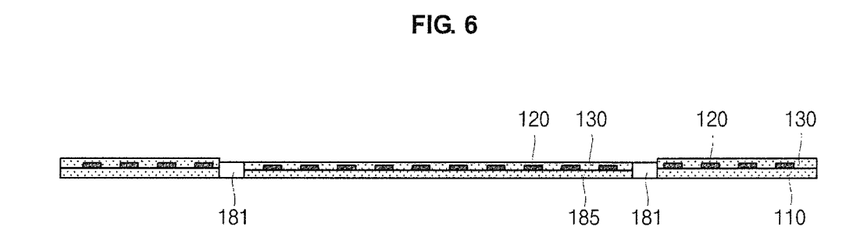
FIG. 6 is a cross-sectional view along line 6-6 of FIG. 1.

Referring to FIG. 6, a cross-sectional view along line 6-6 of FIG. 1 is illustrated. As illustrated, in the flexible circuit substrate 100, the ink layer 185, which is relatively more flexible than the first insulating film 110 of the second region 180, is formed. That is, the ink layer 185 is attached or adhered to the second insulating film 130 instead of the first insulating film 110. Accordingly, flexibility can be more easily obtained in the second region 180. That is, when the panel connector 183 of the second region 180 is bent by a predetermined angle (or folded) such that the panel connector 183 can be coupled to the liquid crystal display panel, stress becomes concentrated on the bending region (or the folding region) to thereby possibly cause damage. Accordingly, such damage can be prevented or reduced by absorbing stress that may occur during a bending (or folding) process by way of the ink layer 185 that is formed in the bent (or folded) second region 180 instead of the first insulating film 110, as described above.

Figure 7:
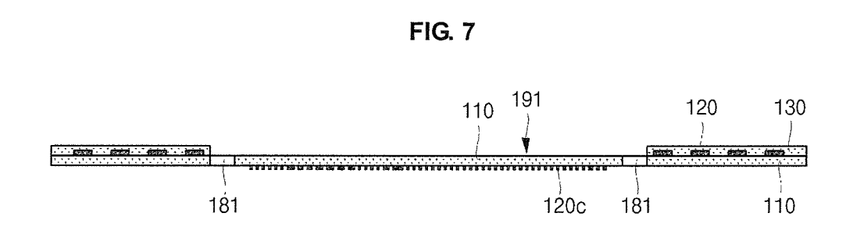
FIG. 7 is a cross-sectional view along line 7-7 of FIG. 1.

Referring to FIG. 7, a cross-sectional view along line 7-7 of FIG. 1 is illustrated. As illustrated, in the flexible circuit substrate 100, a panel connector 183 to which the liquid crystal display panel is coupled is further formed in the second region 180. The panel connector 183 can be a plurality of the conductive pattern 120c exposed to the outside of (or through) the first insulating film 110. That is, by way of the plurality of the conductive pattern 120c coupled to the liquid crystal display panel, various electrical signals are provided to the liquid crystal display panel via the external controller connector 191.

Figure 8:
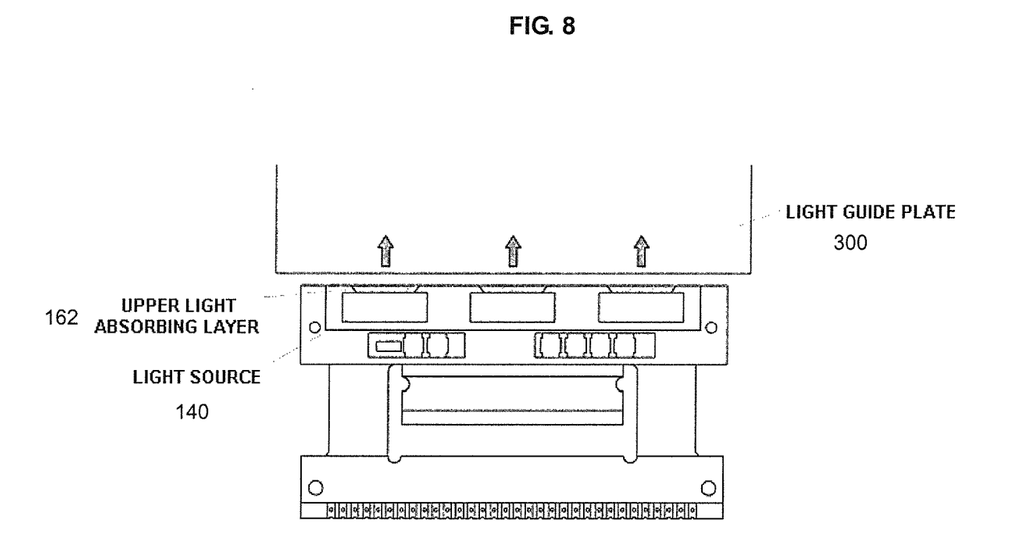
FIG. 8 is a top plan view of an upper light absorbing layer in an inverted triangle shape, a light source, and a light guide plate according to an aspect the present invention.

FIG. 8 illustrates the upper light absorbing layer 162 according to an aspect of the present invention. As illustrated in FIG. 8, the upper light absorbing layer 162 can be arranged between the light sources 140 and a light guide plate 300, and has an inverted triangle shape oriented from the light source to the light guide plate 300. In the non-limiting aspects shown in FIG. 2 and FIG. 8, each of the upper light absorbing layers 162 correspond to each of the light source 140. One of the bases (162a) of the upper light absorbing layers 162 is positioned along an edge of the first region 170 and away from the light source 140. An opposite vertex (or vertex) (162b) of the base (162a) of the upper light absorbing layers 162 is pointed toward the interior of the light source 140.

In various aspects, the upper light absorbing layer 162 can be formed on an upper side of the second insulating film 130 along the entire or partial outer circumference (or perimeter) of the light source 140. In the non-limiting aspect as illustrated in FIG. 8, light emitted from the light source 140 are transmitted toward the light guide plate 300 from the light source 140. Accordingly, even though the upper light absorbing layer 162 is formed in an inverted triangle shape oriented from the light source 140 to the light guide plate 300 so that the upper light absorbing layer 162 is mostly formed along only one edge of the perimeter of the light source 140, there are no remarkable functional differences in terms of light absorption compared to when the upper light absorbing layer 162 is formed along all of the edges of the perimeter of the light source 140. Therefore, if the upper light absorbing layer 162 is formed in an inverted triangle shape, such provides an advantage in terms of the cost required to manufacture a flexible circuit substrate.

The vertex angle θ (of the vertex 162b) of the one side of the upper light absorbing layer 162 in the inverted triangle shape is preferably about 90° (degrees) or more, but not required. The upper light absorbing layer 162 absorbs light emitted from the light source 140. Therefore, if the vertex angle θ is about 90° or less, the upper light absorbing layer 162 is not likely to absorb the light emitted from the light source 140 entirely or at least a required amount. In addition, the vertex angle θ is preferably about 160° or less, but not required. If the vertex angle θ is about 160° or more, there is no remarkable difference in terms of additional absorption of light from a light source 140 compared to that of the vertex angle θ of between about 90° to about 160°. In a non-limiting aspect, the vertex angle θ is most preferably about 120°, but not required. The vertex angle θ of about 120° is a suitable angle to absorb the entire or the suitable amount of light emitted from the light source 140. Therefore, about 120° is one suitable minimum vertex angle θ for the upper light absorbing layer 162 to absorb the light emitted from the light source 140. In a non-limiting aspect, the triangle is an isosceles triangle with two equal angles and two equal sides. In other aspects, the side (i.e., a base) other than the equal sides thereof is disposed along a light emitting side of the light source 140.

In the non-limiting aspect shown, the vertex angle θ described above is only an example to implement a flexible circuit board of a liquid crystal display device having a light absorbing layer according to an aspect of the present invention. Accordingly, aspects of the present invention are not limited to the particular number discussed above, and various modifications can be made without deviating from the scope of the present invention.

As described above, in a flexible circuit board of a liquid crystal display device having a light absorbing layer according to aspects of the present invention the upper light absorbing layer and the lower light absorbing layer are formed along the outer circumference of the light source to minimize the light emitted from the light source from being introduced to the passive elements and the conductive pattern. Therefore, aspects of the present invention can prevent or reduce malfunction of the passive elements and the liquid crystal display panel effectively.

In a flexible circuit board of a liquid crystal display device having the light absorbing layer according to aspects of the present invention, since light emitted from the light source is not introduced into an unwanted region (or an undesired region) (for example, the liquid crystal display panel and a driver IC (integrated circuit) for driving), the screen (or image) quality of the liquid crystal display device can be improved.

In a flexible circuit board of a liquid crystal display device having the light absorbing layer according to aspects of the present invention, the light source and the passive elements are formed in the first region, the panel connector coupled to the liquid crystal display panel is formed in the second region, and the controller connector coupled to an external controller is formed in the third region. Therefore, it is possible to establish an electrical connection ot the many parts on a minimum amount of space effectively. Accordingly, aspects of the present invention are easily applied to portable display devices which are becoming slimmer and lighter.

A flexible circuit board of a liquid crystal display device according to aspects of the present invention includes the first region, the second region, and the third region, which are formed by the flexible first insulating film and/or the flexible second insulating film. Therefore, it is possible to bend and/or fold the desired area easily. Accordingly, aspects of the present invention can be easily applied to various portable display devices having many curved sections.

As for the upper light absorbing layer, since it can be formed in an inverted triangle shape on the upper side of the light source oriented from the light source to the light guide plate, the cost to manufacture the liquid crystal display device is reduced when compared with the case of the upper light absorbing layer being formed on the entire upper side of the second insulating film.

Although discussed in terms of a liquid crystal display device, other types of display devices are within the scope of the invention in other aspects.

In various aspects, the flexible circuit board is applicable to small display devices such as a cellular phone, a PMP (portable multimedia player) a digital camera, and/or similar devices.

Although a few aspects of the present invention have been shown and described, it would be appreciated by those skilled in the art that changes may be made in the aspects without departing from the principles and spirit of the invention, the scope of which is defined in the claims and their equivalents.

What is claimed is:

1. A flexible circuit board of a liquid crystal display, comprising:
    a first insulating film;
    conductive patterns formed on the first insulating film;
    a second insulating film formed on the first insulating film, to cover the conductive patterns;
    a light source coupled to the conductive patterns; and
    a triangular first light absorbing layer disposed on the second insulating film, covering only a portion of a first side of the light source, to absorb light emitted from the light source.

2. The flexible circuit board of a liquid crystal display as claimed in claim 1, wherein the liquid crystal display includes a light guide plate, and the first light absorbing layer is disposed between the light source and the light guide plate.

3. The flexible circuit board of a liquid crystal display as claimed in claim 1, wherein the liquid crystal display includes a light guide plate, and the first light absorbing layer is disposed such that one side thereof is parallel to an adjacent edge of the light guide plate.

4. The flexible circuit board of a liquid crystal display as claimed in claim 3, wherein a vertex of the first light absorbing layer is disposed on the light source and has an angle that ranges from about 90 degrees to about 160 degrees.

5. The flexible circuit board of a liquid crystal display as claimed in claim 4, wherein the angle of the vertex is about 120 degrees.

6. The flexible circuit board of a liquid crystal display as claimed in claim 1, further comprising a second light absorbing layer formed on the second insulating film, so as to cover the light source.

7. The flexible circuit board of a liquid crystal display as claimed in claim 6, wherein the second light absorbing layer is larger than the first light absorbing layer.

8. The flexible circuit board of a liquid crystal display as claimed in claim 6, further comprising a passive element that is coupled to the conductive patterns.

9. The flexible circuit board of a liquid crystal display as claimed in claim 8, wherein the second light absorbing layer is formed on the first insulating film, so as to cover the passive element and the light source.

10. The flexible circuit board of a liquid crystal display as claimed in claim 1, wherein the first light absorbing layer includes diethylene glycol monoethyl ether acetate, titanium dioxide, epoxy resin, or any combinations thereof.

11. The flexible circuit board of a liquid crystal display as claimed in claim 6, wherein the second light absorbing layer includes diethylene glycol monoethyl ether acetate, titanium dioxide, epoxy resin, or any combinations thereof.

12. The flexible circuit board of a liquid crystal display as claimed in claim 1, wherein the light source is a light emitting diode.

13. The flexible circuit board of a liquid crystal display as claimed in claim 1, wherein the liquid crystal display includes a liquid crystal display panel and an external controller, and the first insulating film includes:
    a first region in which the at least one light source and the light absorbing layer are formed;
    a second region formed on one side of the first region, and to which the liquid crystal display panel is coupled; and
    a third region formed on one side of the second region, and to which the external controller to be coupled.

14. The flexible circuit board of a liquid crystal display as claimed in claim 13, comprising, a cutout region including first cutout portions and a second cutout portion; and
    a panel connector, wherein the first cutout portions are spaced apart from each other and are symmetrically formed in the second region, the second cutout portion is formed between the first cutout portions, and the panel connector is coupled to the liquid crystal display panel.

15. The flexible circuit board of a liquid crystal display as claimed in claim 14, wherein the panel connector is formed by exposing the plurality of the conductive patterns through the first insulating film.

16. The flexible circuit board of a liquid crystal display as claimed in claim 13, wherein the third region further comprises a controller connector to be coupled to the external controller.

17. The flexible circuit board of a liquid crystal display as claimed in claim 16, wherein the controller connector is formed by exposing the plurality of the conductive patterns through the first insulating film.

18. The flexible circuit board of a liquid crystal display as claimed in claim 13, further comprising one or more fixing holes formed at each corresponding positions of the first region and/or the third region.

* * * * *